United States Patent

Nishioka

[11] Patent Number: 5,936,409
[45] Date of Patent: Aug. 10, 1999

[54] QUALITY DISCRIMINATION METHOD FOR SCREENING INSPECTION OF CAPACITORS MANUFACTURED

[75] Inventor: Yoshinao Nishioka, Yasu-gun, Japan

[73] Assignee: Murata Manufacturing Co., Ltd., Japan

[21] Appl. No.: 09/009,431

[22] Filed: Jan. 20, 1998

[30] Foreign Application Priority Data

Jan. 20, 1997 [JP] Japan .................................. 9-022138
Jul. 25, 1997 [JP] Japan .................................. 9-215809
Nov. 17, 1997 [JP] Japan .................................. 9-333576

[51] Int. Cl.$^6$ ........................... G01R 31/12; G01R 27/26
[52] U.S. Cl. ........................................ 324/548; 324/519
[58] Field of Search .................................... 324/519, 522, 324/523, 527, 548, 678; 702/65, 81, 82; 361/281

[56] References Cited

U.S. PATENT DOCUMENTS 3,125,720  3/1964  Swift .......................................... 324/548
3,657,602  4/1972  Boehm et al. .......................... 324/548
4,216,424  8/1980  Vette ....................................... 324/548
4,425,541  1/1984  Burkum et al. ......................... 324/548
5,677,634  10/1997  Cooke et al. .......................... 324/548
5,798,648  8/1998  Ueyama et al. ........................ 324/548
5,828,222  10/1998  Chen ....................................... 324/548

*Primary Examiner*—Diep N. Do
*Attorney, Agent, or Firm*—Ostrolenk, Faber, Gerb & Soffen, LLP

[57] ABSTRACT

A capacitor quality discrimination scheme capable of permitting accurate and reliable determination of whether or not a capacitor under inspection is acceptable in quality. To this end, a method for discriminating the quality of a capacitor based on the charge characteristic upon application of a DC voltage thereto includes determining a standardized selection value charge characteristic of the dielectric polarization component of the capacitor, and then quadratically approximating one of (i) the ratio of the capacitor's actual measured current value $m(t)$ and its calculated current value $j(t)$ as obtainable from the standardized selection value charge characteristic, (ii) the difference between $m(t)$ and $j(t)$, (iii) the difference between logarithmic values of $m(t)$ and $j(t)$, and (iv) a ratio of respective logarithmic values of $m(t)$ and $j(t)$. If the secondary coefficient of quadratic curve approximation formula is positive in polarity then the capacitor determined to be a defective product; otherwise, the capacitor is determined to be good.

10 Claims, 8 Drawing Sheets

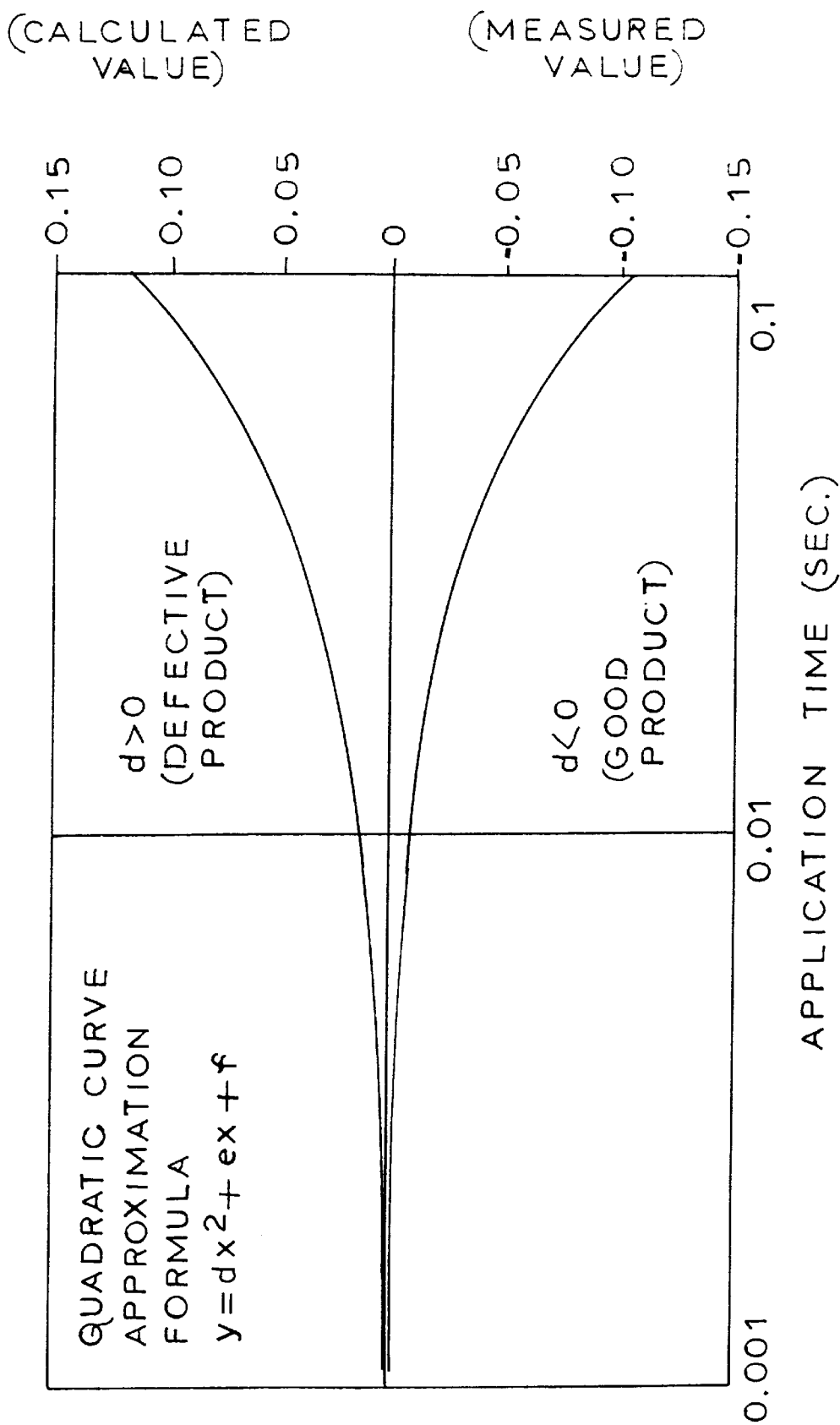

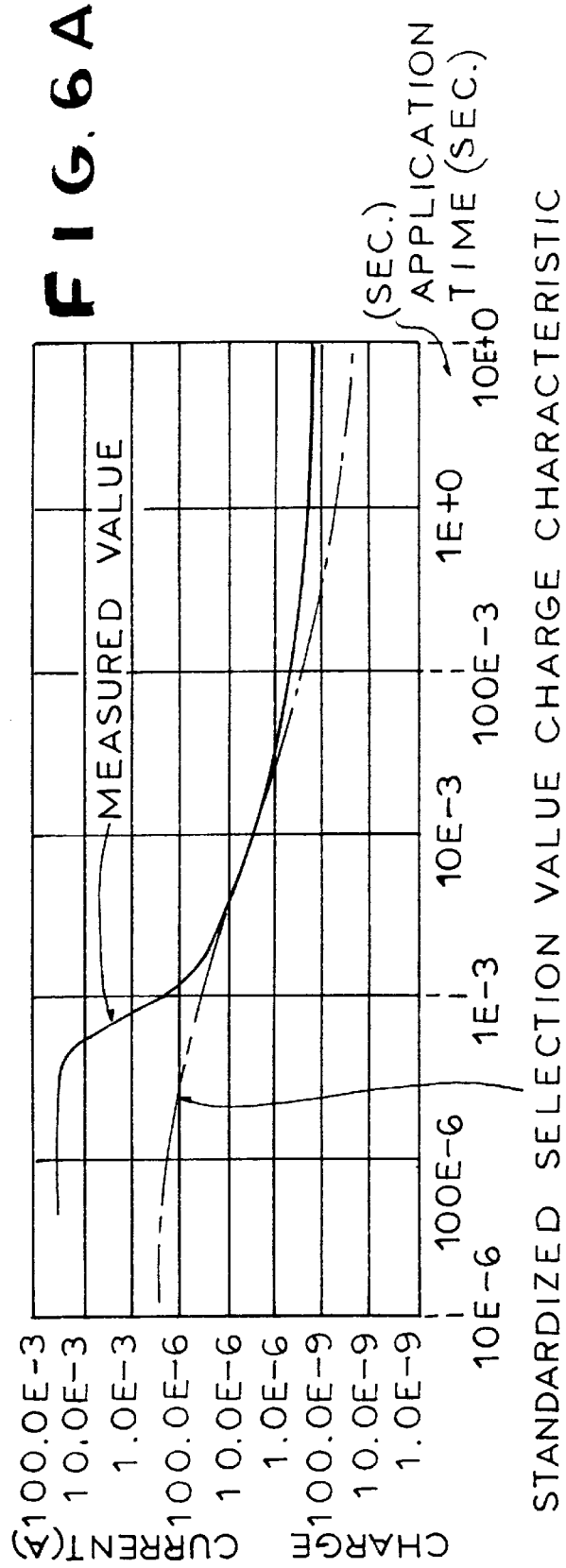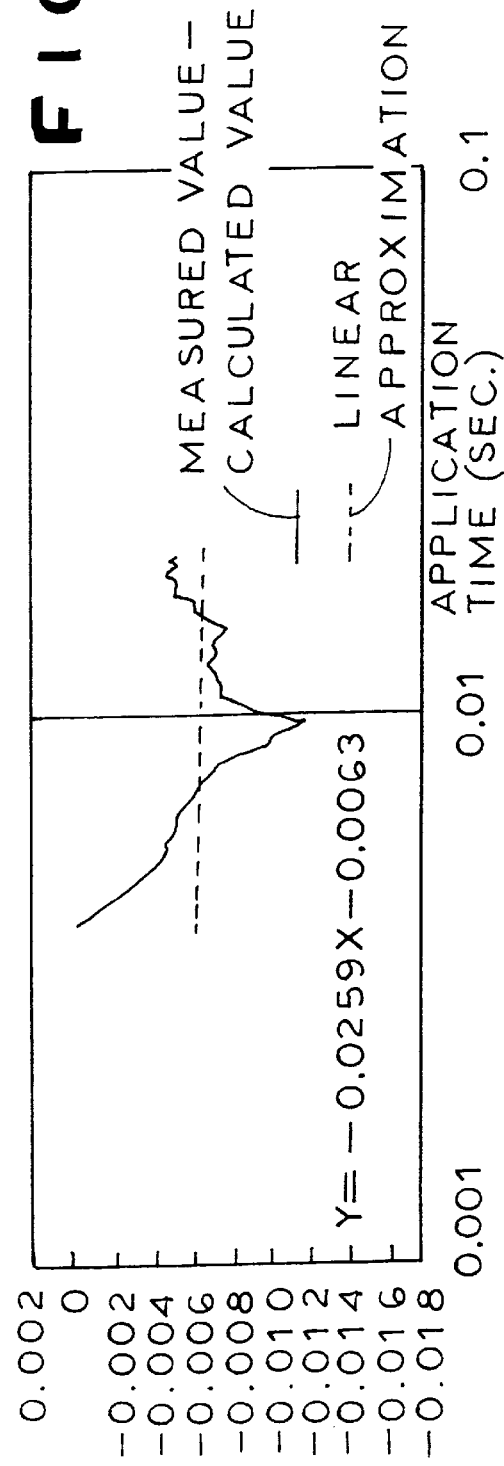

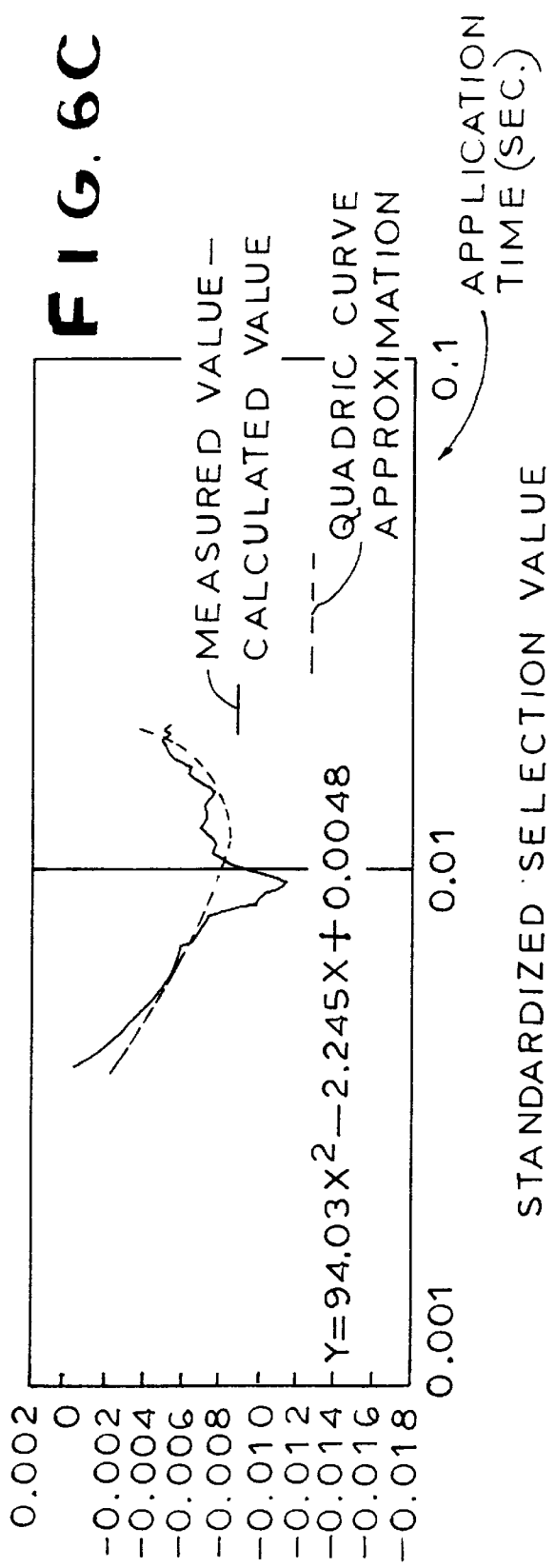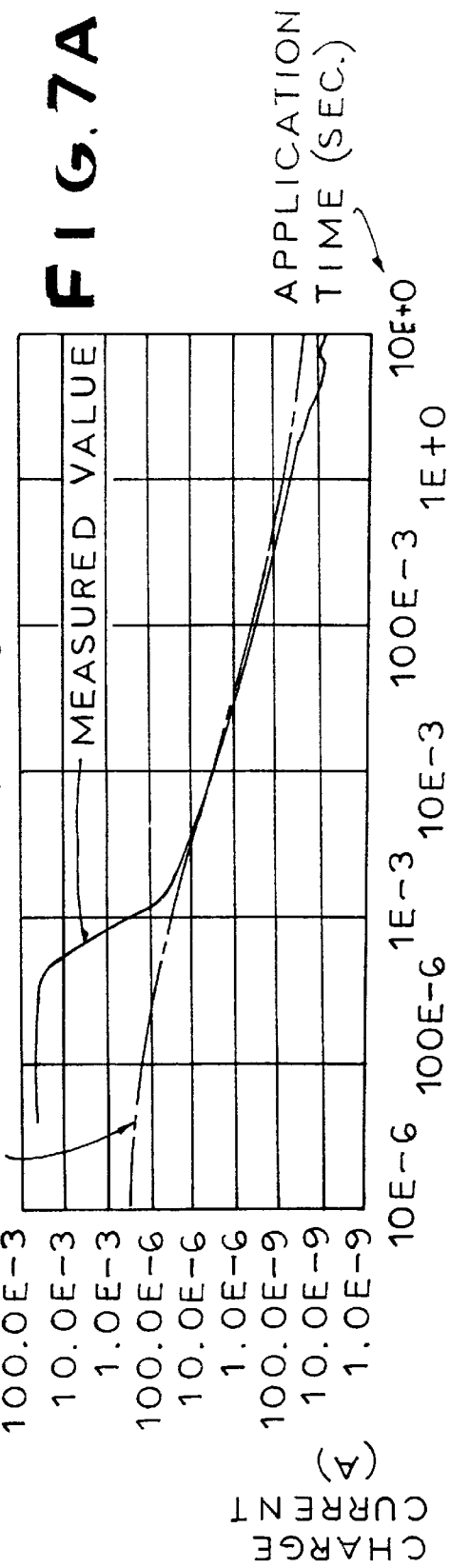

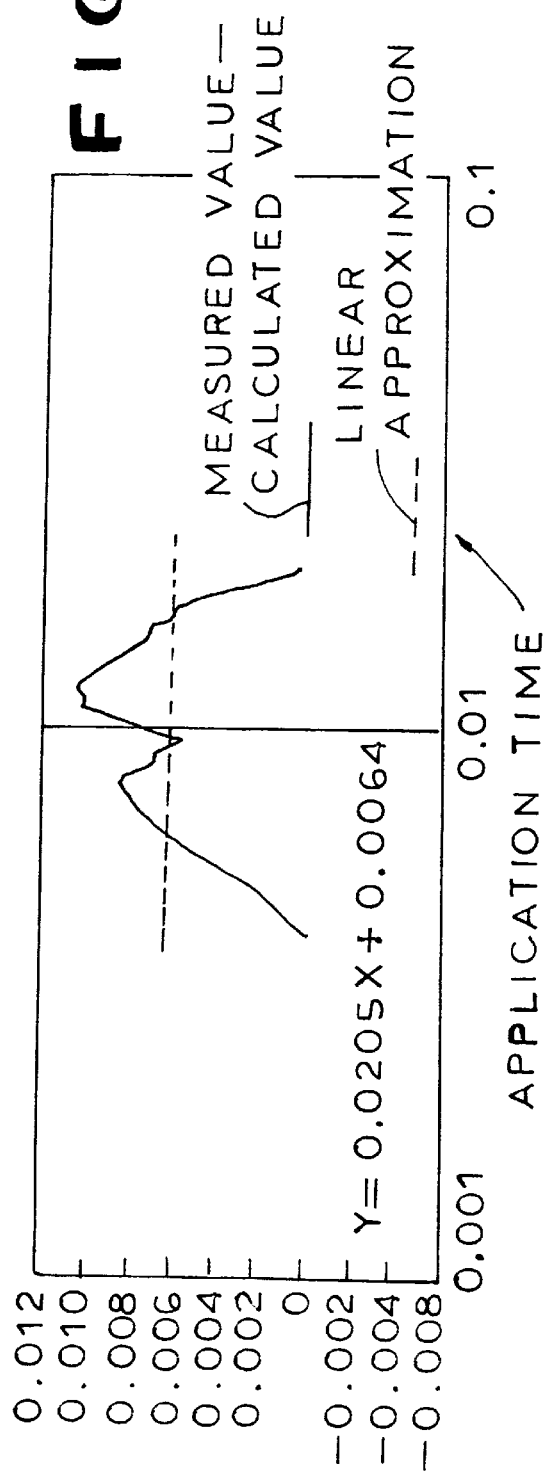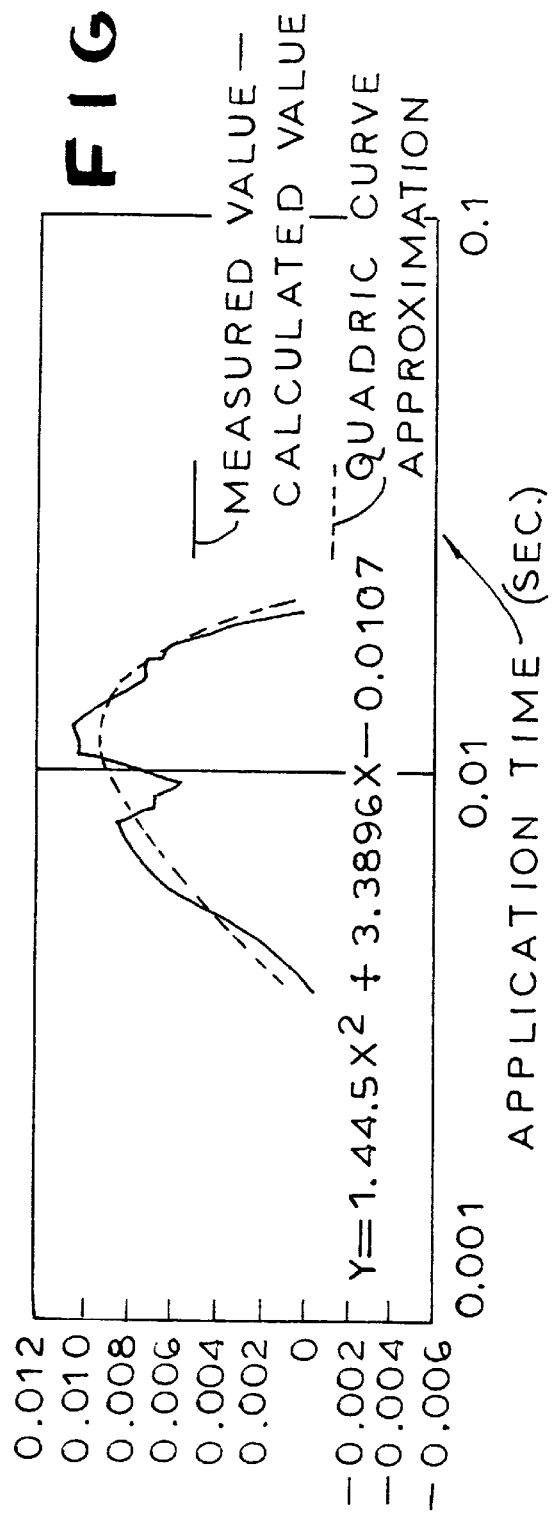

QUALITY DISCRIMINATION METHOD FOR SCREENING INSPECTION OF CAPACITORS MANUFACTURED

BACKGROUND OF THE INVENTION

1. Field of the Invention

The present invention relates generally to electronics product screening inspection architecture and, more particularly, to a method for discriminating capacitor quality based on capacitor charge characteristics upon application of a direct current (DC) voltage thereto.

2. Description of the Prior Art

Generally, a well known method for measurement of the dielectric resistance of capacitors is to measure leakage current (charge current) of a fully charged capacitor while applying thereto a DC voltage. Obviously, good products of expected quality permit less leakage current to flow therethrough.

One prior known approach to the charge current measurement of this type is a measurement scheme as set forth in Japanese Industrial Standards (JIS) C5102. This scheme might require a measurement time duration of approximately sixty (60) seconds due to the necessity of measuring current values of capacitors which are sufficiently charged. However, as the need for electronic equipment or apparatus to offer further cost reduction and reliability enhancement increases, electronic parts or components, including but not limited to capacitors, are likewise required to have further increases in productivity and quality. Prior known measurement methods which require an increased length of measurement time per capacitor are incapable of meeting such needs.

One typical approach to simplified capacitor quality discrimination is to determine whether a capacitor under inspection is good or defective by applying thereto a voltage and then measuring a current value after the elapse of a specified time duration, such as several seconds, and then to compare the resulting measured current value to a predefined threshold value. However, a quality discrimination method using such point data does not result in accurate and reliable discrimination. For, although the data at the time of measurement may indicate a good capacitor, the data change afterwards may indicate that the capacitor is, in fact, defective.

SUMMARY OF THE INVENTION

It is therefore an object of the present invention to provide a quality discrimination scheme for screening inspection of capacitive elements accurately and reliably and which is capable of avoiding the problems encountered with the prior art.

It is another object of the invention to provide a capacitor quality discrimination method capable of rapidly and reliably determining during screening inspection whether a capacitor is good in quality.

To attain the foregoing objects, the instant invention provides a specific method for determining whether a capacitor is acceptable in quality based on charge characteristics upon application of a DC voltage to the capacitor. The method includes the steps of determining a standardized selection value charge characteristic of the dielectric polarization component of the capacitor, and determining whether the capacitor is acceptable by comparing a measured current value characteristic of a dielectric polarization component of the capacitor and the standardized selection value charge characteristic.

In accordance with one aspect of the invention, the step of determining the standardized selection value charge characteristic includes initializing by use of an equivalent circuit of the capacitor a current calculation formula for defining the standardized selection value charge characteristic of the dielectric polarization component, and modifying the current calculation formula by determining both capacitances $C_1, C_2, \ldots, C_n$ and resistances $R_1, R_2, \ldots, R_n$ each acting as the dielectric polarization component of the equivalent circuit to ensure that the actual measured current value m(t) during the initial charge period of dielectric polarization component is identical to the calculated current value j(t) as obtained from the current calculation formula.

In accordance with a further aspect of the invention, the step of modifying the current calculation formula includes determining the capacitances $C_1, C_2, \ldots, C_n$ and resistances $R_1, R_2, \ldots, R_n$ by modifying respective initial terms $C_1, R_1$ and common ratios p, q while causing the capacitances $C_1, C_2, \ldots, C_n$ and resistances $R_1, R_2, \ldots, R_n$ acting as the dielectric polarization component of the equivalent circuit to be put in the relation of geometric progression respectively.

These and other objects, features and advantages of the invention will be apparent from the following more particular description of preferred embodiments of the invention, as illustrated in the accompanying drawings.

BRIEF DESCRIPTION OF THE DRAWINGS

FIG. 3 is a graph showing a relation of evaluation function n(t) versus voltage application time in each of good and defective capacitor products.

FIGS. 6A to 6C are graphs showing experimentally demonstrated major characteristics of one defective capacitor;

FIGS. 7A–7C are graphs showing those of a good product capacitor; and

DETAILED DESCRIPTION OF PREFERRED EMBODIMENT(S)

Before describing one preferred embodiment of the present invention, the process or "history" of conception of the invention will first be explained for purposes of facilitation of understanding the invention.

Figure 1:
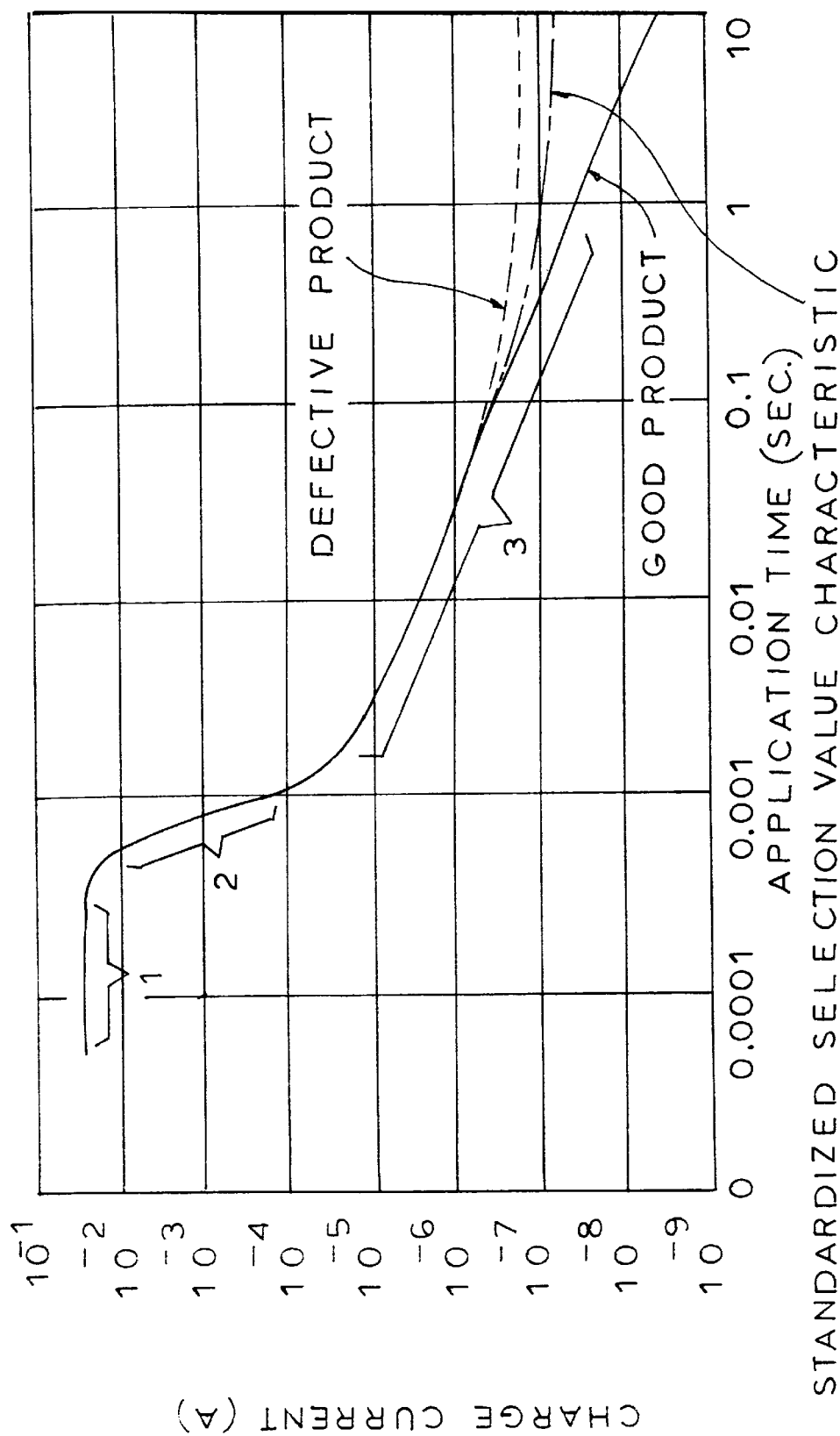
FIG. 1 is a graph showing a relation of a charge current versus voltage application time in a good product capacitor along with that of a defective capacitor.

An attempt was made to accurately measure a change or variation of current value during charging of ceramic capacitors and to plot the resultant current values and time points in a logarithmic current versus logarithmic time coordinate system. This resulted in discovery of the presence of a specific relationship as indicated by a solid line in FIG. 1. More specifically, while an almost constant current tends to flow during a minute period at the beginning of charge operation, as represented in FIG. 1 by the initial charge characteristic designated by the reference numeral 1, the current value sharply dropped during a succeeding transition period, as represented in FIG. 1 by the transition characteristic designated by the reference numeral 2; thereafter, the current decreased while exhibiting a linear charge characteristic with a certain angle of inclination or "gradient", as represented in FIG. 1 by the linear charge characteristic designated by the reference number 3. This linear charge characteristic 3 was retained until a time elapse of one to two minutes from the beginning of the charge operation.

Figure 2:
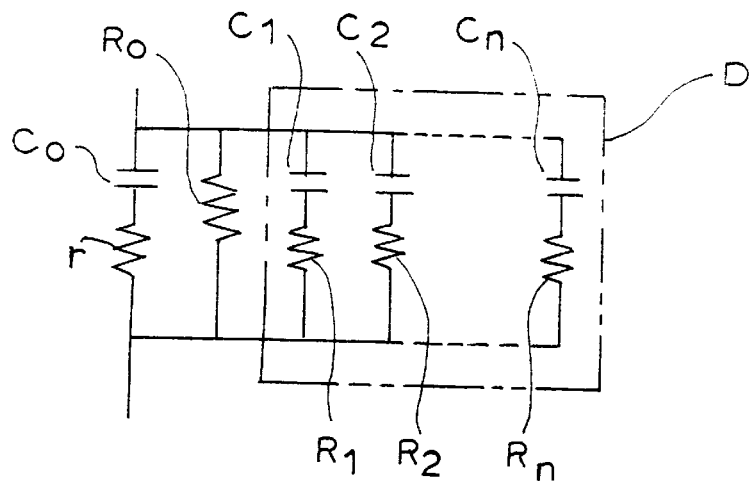
FIG. 2 is a diagram showing equivalent circuitry of a capacitor.

Further analysis of the above characteristic revealed the following: while equivalent circuitry of a capacitor may consist of a capacitor $C_0$, equivalent series resistance r, dielectric resistor $R_0$ and dielectric polarization component D, as shown in FIG. 2, the initial charge characteristic 1 belongs to the charge period of capacitor $C_0$, whereas the linear charge characteristic 3 is in the charge region of the dielectric polarization component D.

Obviously, good-product capacitors exhibit a charge characteristic which follows the linear charge characteristic 3 of FIG. 1. In contrast, detective capacitors are such that while these exhibit substantially the linear charge characteristic at the very beginning of charge operations, as shown by a broken or dotted line in FIG. 1, the go-down rate or speed of current value decreases with time. Generally speaking, it is after the elapse of several seconds upon voltage application that clear and distinct differences take place between good products and defective ones. However, a certain pre-phenomenon or "sign" thereof is already observable at a time point several tens of millisecond after voltage application. To be more specific, calculating a difference between a defective product's actual measured current values and a good product's actual measured current values reveals that the resulting difference exhibits a tendency of a gradual increase with time toward the positive direction.

In light of the above fact, the present invention is arranged in a way such that while, as indicated by a two-dot or phantom line in FIG. 1, the standardized selection value charge characteristic is specifically set within an intermediate or "mid" region between good products (solid line) and defective products (broken line), the capacitor quality is discriminated by comparing a measured current value characteristic of a dielectric polarization component of the capacitor and the standardized selection value charge characteristic. In the prior art, point data are used, namely, the capacitor quality is discriminated by determining whether each datum is over or under the predefined threshold value. On the other hand, according to the present invention, the capacitor quality is discriminated by comparing continuous data of the dielectric polarization component.

Specifically, one method for discriminating capacitor quality is that the following evaluation function n(t) is defined, a quadratic-curve approximation is performed to this evaluation function n(t), and capacitor quality is discriminated by determining whether the second-order coefficient of the quadratic-curve approximation formula is positive or negative:

$n(t) = \log m(t) - \log j(t)$ $n(t) = \log m(t)/\log j(t)$ $n(t) = m(t)/j(t)$ $n(t) = m(t) - j(t)$ In the evaluation functions above, m(t) is defined as a measured current value of the capacitor, and j(t) is defined as a calculated current value from the standardized selection charge value characteristic.

In either case, the capacitor quality can be discriminated by determining whether the second-order coefficient of the quadratic-curve approximation formula is positive or negative.

FIG. 3 shows how n(t) varies with time; it can be seen from this diagram that the capacitor's charge characteristic may be discriminatable by verifying whether the second-order coefficient d is positive or negative in polarity. More specifically, where the second-order coefficient d is positive, this means that the quadratic curve approximation formula permits drawing of a downwardly projected curve—in other words, the rate of decrease of actual measured current value is less than the standardized selection value charge characteristic as time elapses—so that the capacitor is determined as a defective product; in contrast, if the second-order coefficient d is negative then the capacitor is judged as a good product. One significant feature of the use of such discrimination method lies in the capability of reliably determining or judging whether the capacitor under inspection is good or bad in quality even at a pre-stage, whereat certain distinct difference arises between good and defective products—namely, within a noticeably shortened time period, such as the mere time elapse of several tens of millisecond from initiation of voltage application thereto.

Another advantage is that the use of such quadratic curve approximation scheme may enable accomplishment of reliable and stable quality discrimination for screening inspection because the entire or general tendency may remain recognizable even where the parameter n(t) can temporarily change or vary in value due to the occurrence of noise.

While the method of determining the standardized selection value charge characteristic may be done by setting it along a predefined characteristic curve, this will not always insure exact coincidence or consistency with the actual characteristic of the dielectric polarization component of a capacitor. Then, another approach may be employed which includes the steps of using the capacitor's equivalent circuit to initialize the current calculation formula of the dielectric polarization component, and then modifying the current calculation equation by determining the capacitance values $C_1, C_2, \ldots, C_n$ and resistance values $R_1, R_2, \ldots, R_n$ which may serve as the dielectric polarization component of the equivalent circuit such that the capacitor's actual measured current value m(t) is identical to the calculation current value j(t) as obtained from the above current calculation formula. With this method, it becomes possible to successfully determine the exact standardized selection value charge characteristic which permits consistency with each dielectric polarization component of the individual one of capacitors under inspection which, in turn, may enable achievement of high accuracy product quality discrimination.

When determining the capacitances $C_1, C_2, \ldots, C_n$ and resistances $R_1, R_2, \ldots, R_n$, representing them by specified relational expression may facilitate determination thereof. To this end, the capacitances and resistances are each put in the relation of geometric progression for calculation of the first term $C_1, R_1$ of each and the common ratios p, q, thereby making it possible to easily define the capacitances $C_1, C_2, \ldots, C_n$ and resistances $R_1, R_2, \ldots, R_n$.

Further, in order to evaluate the degree of coincidence between the capacitor's actual measured current value m(t) and calculated current value j(t), the current calculation equation can be easily modified by performing a linear approximation of the following evaluation function n(t):

$n(t) = \log m(t) - \log j(t)$ $n(t) = \log m(t)/\log j(t)$ $n(t)=m(t)/j(t)$ $n(t)=m(t)-j(t)$ In the present invention, a common logarithm, a natural logarithm, or any arbitrary logarithms can be used as a logarithm.

Figure 4:
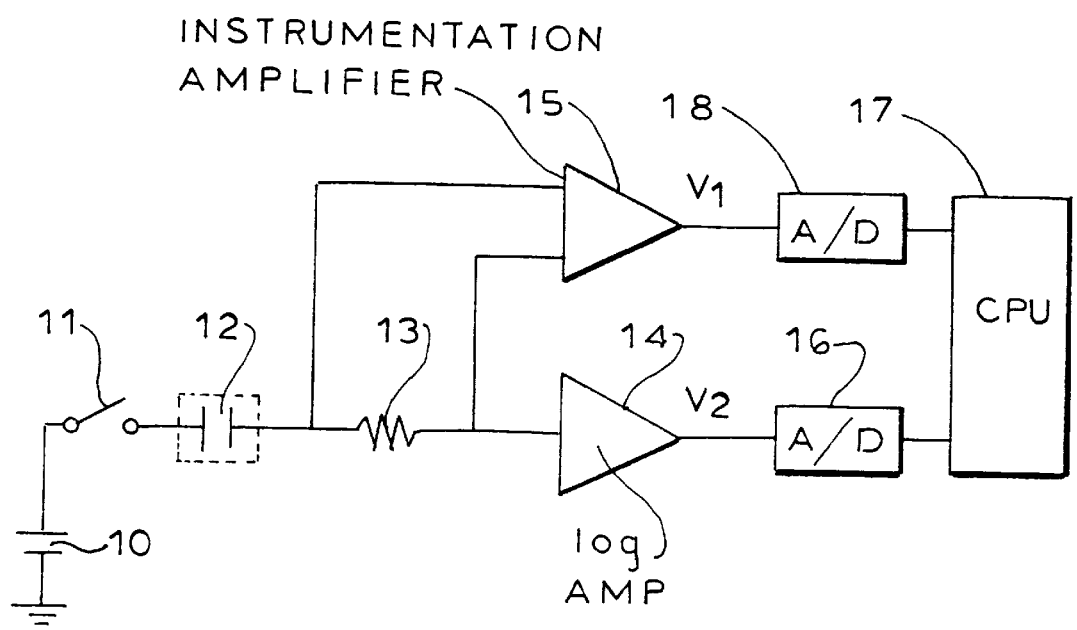
FIG. 4 is a diagram showing a configuration of current measurement apparatus for use in implementing the capacitor quality discrimination method embodying the invention.

See FIG. 4, which shows one exemplary current measurement device adaptable for use in practicing the method of the present invention. This measurement device has been proposed and disclosed in Published Unexamined Japanese Patent Application (PUJPA) No. 7-293442 as filed under the name of the same applicant.

This measurement device includes a DC measurement power supply 10, a switch 11, a capacitor 12 to be measured, a current control resistor 13, a logarithmic amplifier 14, an instrumentation amplifier 15, analog-to-digital (A/D) converters 16, 18, and an arithmetic processor circuit (central processing unit or "CPU") 17. At the beginning of charge operation, the measurement amplifier 15 is operable to measure a current value; at a predefined threshold value, it is switched to the logarithmic amplifier 14 which will be rendered operative for continuous measurement of current values thereafter. This measurement device features the capability of offering accurate measurement even when the charge current of capacitor 12 varies over a wide range which, in turn, makes it possible to continuously measure intended current values throughout a "seamless" range covering the period from the charge startup to charge termination, which is otherwise difficult to do in prior art devices.

It is to be noted that the method of the invention is not exclusively limited to use of the measurement device shown in FIG. 4 and this device may alternatively be replaced with any device whether or not presently known which is capable of performing the specified measurement function.

A capacitor quality discrimination method in accordance with one preferred embodiment of the invention will now be explained below.

First, as has been described supra, an equivalent circuit of the capacitor may be represented as shown in FIG. 2. Here, the capacitances $C_1, C_2, \ldots, C_n$ and resistances $R_1, R_2, \ldots, R_n$ which are the dielectric polarization component of the equivalent circuit shown in FIG. 2 are put in the relation of geometric progression as follows:

$C_k = p^{k-1} C_1, R_k = q^{k-1} R_1$ where $k=1, 2, \ldots, n$; and $C_1, R_1, p, q$ are constant numbers.

The equation of a current that flows in the equivalent circuit may be given as follows:

$$j(t) = \frac{E}{R_0} + E \sum_{k=1}^{n} \frac{1}{R_k} \exp\left(\frac{-t}{C_k R_k}\right) \quad (1)$$

where E is the application voltage to the capacitor, t is the time, and $R_0$ is the dielectric resistance.

In Equation (1) the first term thereof is representative of a current flowing through the dielectric resistance $R_0$, whereas the second term is indicative of a current flowing through the dielectric polarization component D. Additionally, a certain current may also flow in a series circuit of capacitance $C_0$ and equivalent series resistance r at the beginning of charge operation; such current is neglected here because it has no direct relation to the current calculation equation of the present invention.

The parameters $C_1, R_1, p, q$ are determined so that the calculation current value $j(t)$, calculated as discussed above is identical to the actual measured current value m(t) as actually measured using the current measurement device of FIG. 4. Note that no further modifications of $R_0$ will be done after completion of its initial value setting.

Since the parameters $C_1, R_1, p, q$ are variable in value among several capacitors under inspection, the current calculation equation (1) is modified in a way which follows. To do this, the degree of coincidence of the calculation current value j(t) and actual measured current value m(t) is evaluated as will be explained below.

First, the evaluation function n(t) is set as follows:

$n(t) = \log m(t) - \log j(t)$.

Then, a linear approximation of the evaluation function n(t) obtained from the above equation is performed. The approximation formula as used herein may be represented by a first-order or linear equation: $y=ax+b$. Note that the coincidence degree is high as the inclination a and intercept b come closer in value to zero (0). At this time, setting the inclination a and intercept b at selected values near zero may increase the accuracy of quadratic curve approximation which is to be next performed. Additionally, the evaluation time point t is so set as to fall within the initial period of the charge region 3 of the dielectric polarization component D of FIG. 1 (several milliseconds to several tens of millisecond, by way of example). This period differs depending on whether the degree of coincidence is evaluated by high-speed, or by high-accuracy. Namely, the period can be selected arbitrarily in accordance with each objective.

Figure 5:
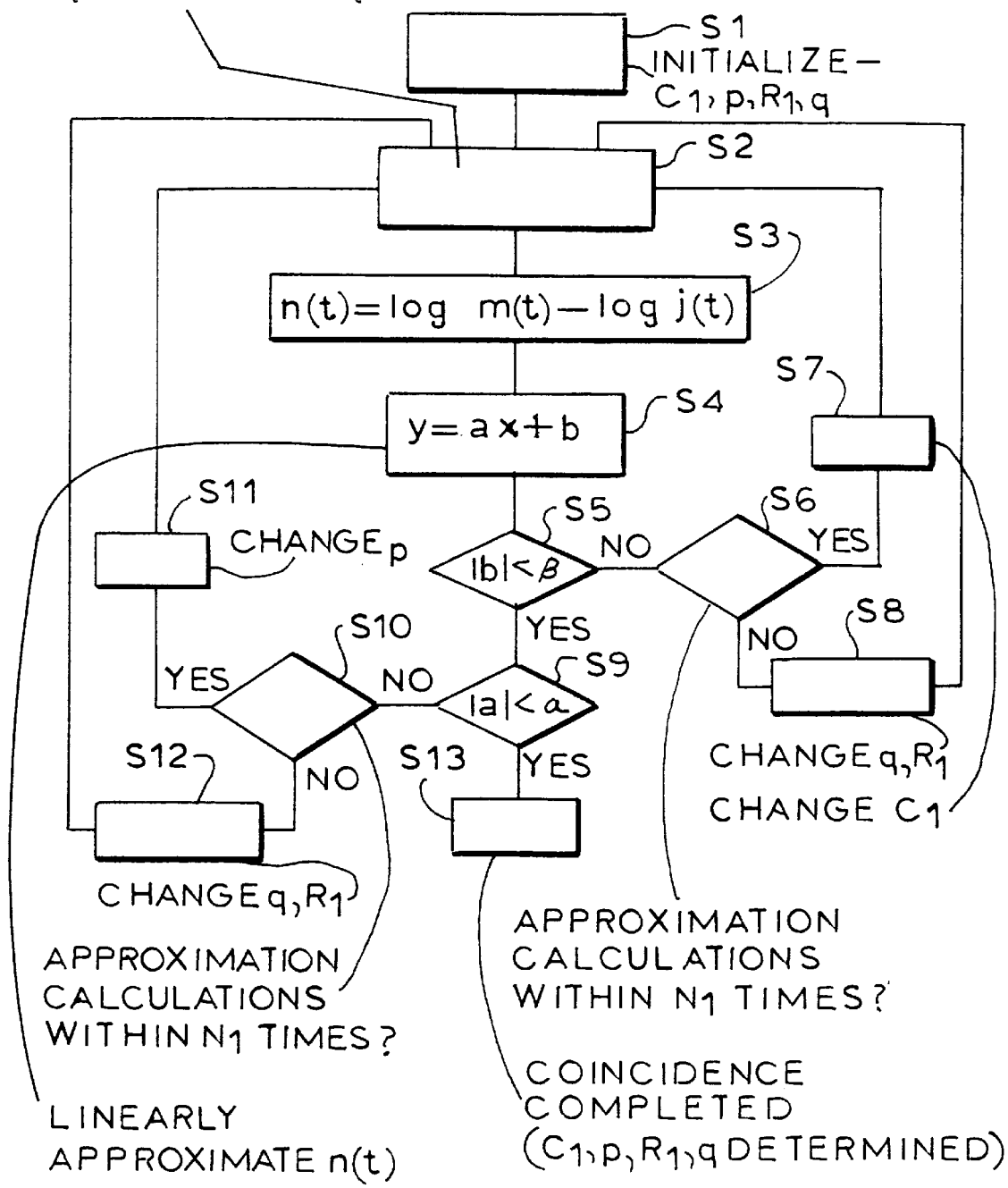
FIG. 5 is a flow diagram of a method for determining parameters using linear approximation scheme for use with the quality discrimination method.

Turning now to FIG. 5, the flowchart shown therein represents the routine of a method for modifying the parameters $C_1, R_1, p, q$ by use of the linear approximation scheme. As shown, the routine begins at step S1 with initial setting or "initialization" of the parameters $C_1, R_1, p, q$. The routine goes then to step S2 which obtains the calculation current value j(t) in the dielectric polarization component charge region 3 of FIG. 1 (near a time point of the elapse of 10 milliseconds after initiation of charging operation, for example) from the calculation equation (1) using such initialized parameters.

Subsequently, the routine enters step S3 for measuring an actual measured value m(t) at the same time point, and then obtaining the evaluation function n(t) based on a logarithmic value difference between the actual measured value m(t) and calculated value j(t). The routine goes next to step S4 which linearly approximates the evaluation function n(t). At step S5, it is determined whether the absolute value of the intercept b of linear approximation formula $y=ax+b$ is less than a predefined value $\beta$ (for example, $\beta=0.01$). This step S5 is for judging whether the intercept b is near zero.

If $|b| \geq \beta$ at step S5 then determine if the approximation calculation number is within a specified number $N_1$ at step S6. This is a processing for elimination of occurrence of any infinite loops. If the approximation calculation number is less than or equal to $N_1$ then the routine goes to step S7 which increments or decrements $C_1$ by a fixed value depending upon whether b is positive or negative. Alternatively, if the approximation calculation number is greater than or equal to $N_1$—this means that modification of $C_1$ cannot cause the intercept b to approach zero—then increment or decrement q and/or $R_1$ by a constant value depending upon whether b is positive or negative at step S8. After modification of $C_1$ or q, $R_1$ at step S7 or S8, repeat the steps S2 through S5.

If $|b|<\beta$ at step S5 then the routine goes to step S9 for determining whether the absolute value of the inclination a of the approximation formula is less than a specified value α (for example, α=0.05). At step S9, if $|a| \geq α$ then determine whether the approximation calculation number is within a predetermined number $N_2$ at step S10. This is also the processing for elimination of infinite loops.

If YES at step S10, i.e. if the approximation calculation number is less than or equal to $N_2$ then the routine goes to step S11 which increments or decrements q by a fixed value depending upon whether a is positive or negative. Alternatively, if NO at step S10, that is, if the approximation calculation number is more than or equal to $N_2$—this means that modification of p cannot cause the inclination to approach zero—then increment or decrement q and/or $R_1$ by a fixed value depending upon whether a is positive or negative at step S12. After modification of p or q and/or $R_1$ at step S11 or S12, repeat the steps S2 to S9; if $|b|<β$ and $|a|<α$ then judge that incidence was completed at step S13; in other words, finally determine the parameters $C_1$, $R_1$, p, q.

After determination of the parameters $C_1$, $R_1$, p, q by the linear approximation scheme, namely after determination of the current calculation equation (1) that defines the standardized selection value charge characteristic, approximate by known quadratic curve approximation techniques the difference n(t)=log m(t)–log j(t) between the actual measured current value m(t) and calculated current value j(t). More specifically, discriminate whether the capacitor under inspection is good or defective by checking whether the second-order coefficient d is positive or negative where the approximation formula of the evaluation function n(t) is represented as $y=dx^2+ex+f$.

Where the second-order coefficient d is positive, this means that a decrease in actual measured current value m(t) becomes smaller with time as compared to the standardized selection value. If this is the case, the capacitor under inspection must be defective; otherwise, if the second-order coefficient d is negative, then the capacitor under test is determined to be a good product.

FIG. 6A represents the actual measured data in defective products and standard selection value charge characteristic. More specifically, it can be seen that even with such defective products, the initial characteristic thereof remains almost similar to that of good products; however, after elapse of one to ten seconds, a decrease in current value becomes less than the standardized selection value charge characteristic.

FIG. 6B demonstrates the result of linear approximation of the evaluation function n(t), wherein the broken line represents an approximation straight line. The approximation formula is such that both the inclination a and intercept b thereof are near zero as will be presented below ensuring that the degree of coincidence is high:

$$y=-0.0259x-0.0063.$$

FIG. 6C is the result of quadratic curve approximation of n(t) after modifying the current calculation equation (1) of the standardized selection value charge characteristic with the linear approximation being carried out as discussed supra. It should be apparent from viewing FIG. 6C that the approximation quadratic curve is a specific curvature with downward projection, i.e. its second-order coefficient d is positive; in such a case, the capacitor under inspection must be a defective product.

Note here that, as is apparent from FIG. 6C, while the value of n(t) significantly varies due to noise at or near a time point of 10 milliseconds, stable and reliable quality discrimination free from the effects of noise is still achievable because use of the quadratic curve approximation method of the present invention offers recognizability of the entire tendency of n(t).

FIG. 7A is a graph showing the actual measured data in good products and standard selection charge characteristic thereof. More specifically, even with good products, the initial characteristic thereof is almost similar to that of defective ones; however, upon elapse of one to ten seconds, a decrease in current value becomes greater than the standardized selection value charge characteristic.

FIG. 7B shows the result of linear approximation of the evaluation function n(t), wherein the broken line designates an approximation straight line. The approximation formula is such that both the inclination a and intercept b thereof are near zero, as below, which, in turn, indicates that the degree of coincidence is high:

$$y=-0.0205+0.0064.$$

FIG. 7C is the result of quadratic curve approximation of n(t) after modification of the current calculation equation (1) of the standardized selection value charge characteristic with the linear approximation being effectuated in the way as earlier mentioned. It should be apparent from FIG. 7C that the approximation quadratic curve is a curvature with an upward projection, i.e. its second-order coefficient d is negative; in such case, the capacitor under inspection must be a good product.

The above good/defect discrimination could be done within a shortened time period spanning from the initiation of voltage application to the elapse of several tends of millisecond.

Figure 8:
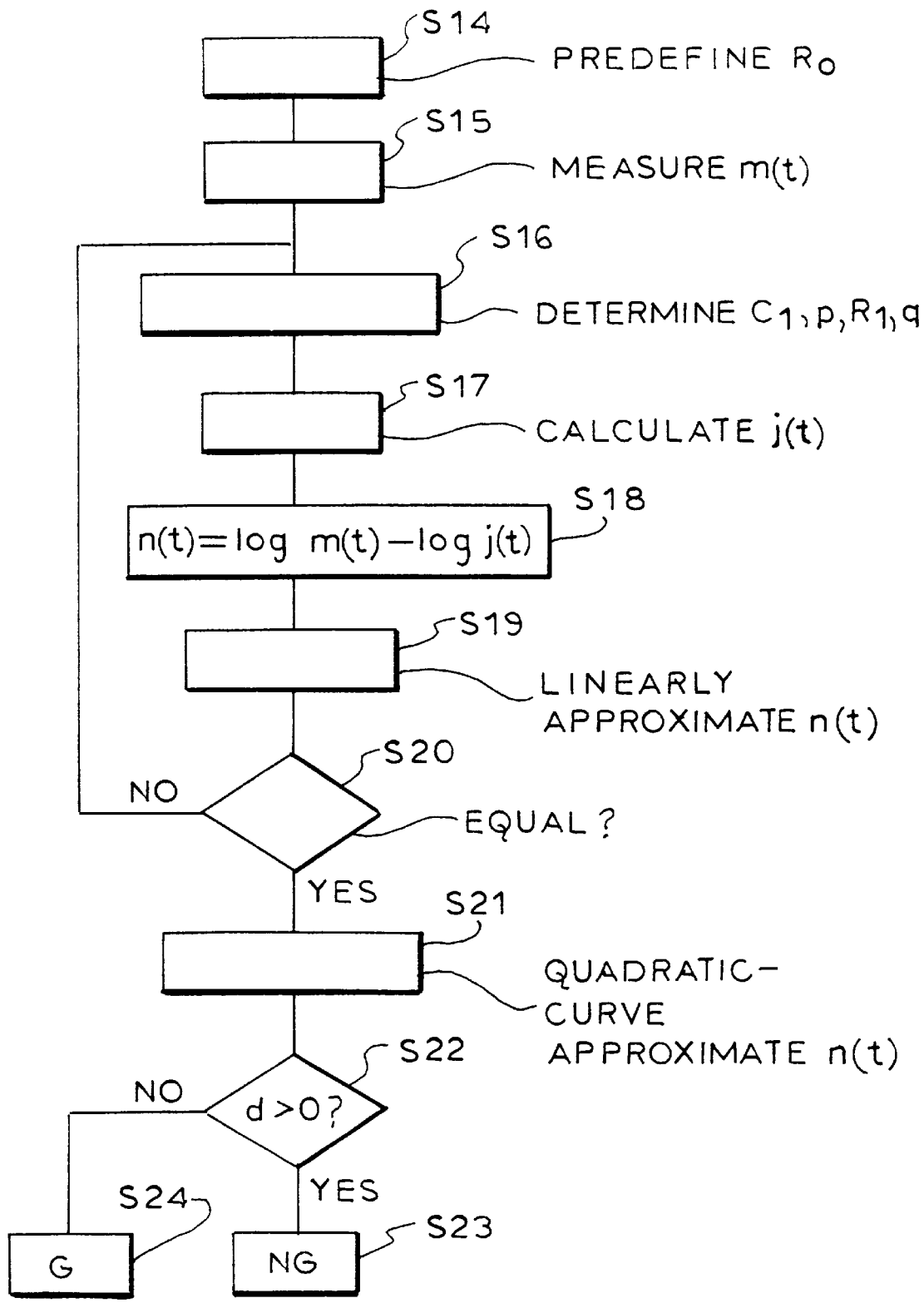
FIG. 8 is a flowchart for the quality discrimination method embodying the invention.

Referring to FIG. 8, the flowchart shown herein represents the entire procedure of the capacitor quality discrimination method embodying the invention. As shown, the procedure begins at step S14 with determination of the dielectric resistance $R_0$ at a specified value (500 megaohms, 1 gigaohm, or the like) depending upon the type of capacitor under inspection. The procedure then goes to step S15 which measures the current value m(t) at the beginning (5 to 20 milliseconds, for instance) of charge operation. Next, at step S16, the parameters $C_1$, $R_1$, p, q are determined. The initial values of these parameters may be set at previously determined known values in a manner similar to that of FIG. 5.

The procedure then enters step S17 which makes use of the determined parameters to obtain the calculation current value j(t) using the current calculation equation (1). Then, at step S18, the evaluation function n(t) based on a difference between the actual measured current value m(t) and the calculated current value j(t) as defined by calculation is obtained. Next, at step S19, the evaluation function n(t) is linearly approximated. The procedure further goes to step S20 for determining whether the degree of coincidence due to such linear approximation is high. A judgment method as employed herein may be such that judgment is based on whether the inclination a and intercept b are near zero.

If NO at step S20, that is, when the coincidence degree is low, then the procedure goes back at step S16 to modify the parameters $C_1$, $R_1$, p, q and then repeats the processing following the step S16. Additionally, the processing at steps S16–S20 may be the same as those of FIG. 5. Alternatively, if YES at step S20, i.e. if the coincidence degree of linear approximation is high, then the procedure goes to step S21 which subsequently performs quadratic curve approximation of the evaluation function n(t). Then, at step S22, it is determined whether the second-order coefficient d of the quadratic curve approximation formula is positive or negative. If YES at step S22, that is, if d is positive, then the capacitor is judged as a defective product at step S23;

otherwise, if NO at step S22, i.e. if d is negative the capacitor is judged as a good product at step S24.

In the foregoing embodiment, while the evaluation function n(t) is defined based on the logarithmic value difference between the actual measured value m(t) and calculated value j(t), the present invention should not exclusively be limited thereto; alternatively, intended quadratic curve approximation may be attainable by defining it by the logarithmic value ratio of actual measured value m(t) and calculated value j(t), the ratio of the actual measured value m(t) to calculated value j(t), or the difference between actual measured value m(t) and calculated value j(t). More specifically, $$n(t) = \log m(t)/\log j(t),$$

$$n(t) = m(t)/j(t),$$

$$n(t) = m(t) - j(t).$$

Further, it may still alternatively be employable to make use of the evaluation function n(t) for linear approximation. Note here that where the evaluation function n(t) is defined as log m(t)/log j(t) or m(t)/j(t), evaluation of the coincidence degree of linear approximation is dependent upon whether the intercept b of the linear approximation formula y=ax+b is near one (1) while the inclination a is near zero.

Note also that if the evaluation function n(t) is defined as log m(t)−log j(t) or m(t)−j(t), evaluation of the coincidence degree of linear approximation is dependent upon whether the inclination a and the intercept b are near zero.

In the embodiment stated supra, the method for determining the standardized selection value charge characteristic of dielectric polarization component is such that it includes performing initial setting of the current calculation equation of dielectric polarization component by use of the equivalent circuit of a capacitor and then modifying the current calculation equation by correcting or adjusting the capacitances $C_1, C_2, \ldots, C_n$ and resistances $R_1, R_2, \ldots, R_n$ so as to let the actual measured current value m(t) be identical to the calculation current value j(t); however, such modification processing will no longer be required in cases where the standardized selection value charge characteristic is predeterminable.

Also, while the capacitances $C_1, C_2, \ldots, C_n$ and resistances $R_1, R_2, \ldots, R_n$ which constitute the dielectric polarization component of the equivalent circuit are set in the relation of geometric progression, these may alternatively be set in any relations other than such geometric progression as far as such is the method which may guarantee determinability of capacitances $C_1, C_2, \ldots, C_n$ and resistances $R_1, R_2, \ldots, R_n$ based on the coincidence degree of actual measured current value m(t) and calculated current value j(t).

Additionally, the present invention should not exclusively be limited to ceramic capacitors and may alternatively be applicable to any types of capacitors insofar as these are capacitors having one or more dielectric polarization components, such as electrolytic capacitors, film capacitors and any equivalents thereto.

It has been described that according to the present invention, it becomes possible to attain intended quality discrimination within an extremely shortened time period such as several tens of millisecond or around it without having to wait for the elapse of several seconds after initiation of voltage application thereto. This can be said because the method is specifically arranged to include the steps of a quadratic-curve approximating any one of the ratio of the capacitor's actual measured current value upon application of voltage thereto versus the calculation current value as obtained from the standardized selection value charge characteristic and each logarithmic value difference as well as each logarithmic value ratio, and then determining whether the secondary coefficient of quadratic curve approximation formula is positive or negative for discrimination of capacitor quality.

Further, the use of such quadratic curve approximation scheme may increase recognizability of the entire tendency which, in turn, leads to capability of stable and reliable capacitor quality discrimination for screening inspection with judgment results being free from any possible adverse effects of noise.

Furthermore, the method is arranged to include obtaining the current calculation equation from the capacitor's equivalent circuit, modifying the calculation equation by comparing the actual measured current value in a charge region of the dielectric polarization component at the beginning of voltage application with its corresponding calculated current value, and then performing quadratic curve approximation by use of the calculated current value as obtained by this modified calculation equation, thereby to enable achievement of accurate capacitor quality discrimination even where the individual capacitor suffers from variations or deviations in characteristics.

While the invention has been described with reference to specific embodiment(s), the description is illustrative of the invention and is not to be construed as limiting the invention. Various modifications and applications may occur to those skilled in the art without departing from the true spirit and scope of the invention as defined by the appended claims.

What is claimed is:

1. A method for determining whether a capacitor is acceptable in quality based on charge characteristics upon application of a direct current voltage to the capacitor, said method comprising the steps of:

determining a standardized selection value charge characteristic of a dielectric polarization component of the capacitor; and discriminating the quality of the capacitor by comparing a measured current value characteristic of a dielectric polarization component of the capacitor and the standardized selection value charge characteristic.

2. The method according to claim 1, wherein the step of discriminating the quality of the capacitor includes the steps of:

(a) quadratic-curve approximating one of: (i) a ratio of an actual measured current value m(t) of the capacitor versus a current value j(t) as calculated from the standardized selection value charge characteristic, (ii) the difference between m(t) and j(t), (iii) the difference between logarithmic values of m(t) and j(t), and (iv) a ratio of respective logarithmic values of m(t) and j(t); and (b) discriminating the quality of the capacitor by determining whether a second-order coefficient of the quadratic curve approximation determined in step (a) is positive or negative.

3. The method according to claim 2, wherein the step of determining the standardized selection value charge characteristic includes:

initially setting a current calculation equation for defining the standardized selection value charge characteristic of the dielectric polarization component by use of an equivalent circuit of the capacitor, the equivalent circuit having capacities $C_1, C_2, \ldots, C_n$ and resistances $R_1, R_2, \ldots, R_n$ acting as the dielectric polarization component of the equivalent circuit; and modifying the current calculation equation by determining both the capacitances $C_1, C_2, \ldots, C_n$ and the resistances $R_1, R_2, \ldots, R_n$ so that the actual measured current value m(t) during an initial charge period of the dielectric polarization component is substantially identical to the calculated current value j(t) as obtained from the current calculation equation.

4. The method according to claim 3, wherein the capacitances $C_1, C_2, \ldots, C_n$ and the resistances $R_1, R_2, \ldots, R_n$ have the respective geometric progression relations of $C_k = p^{k-1}C_1$ and $R_k = q^{k-1}R_1$, where $k=1, 2, \ldots, n$, and the step of modifying the current calculation equation includes:

determining the capacitances $C_1, C_2, \ldots, C_n$ and resistances $R_1, R_2, \ldots, R_n$ by modifying one or more of $C_1, R_1$ and p, q so that the actual measured current value m(t) during an initial charge period of the dielectric polarization component is substantially identical to the calculated current value j(t) as obtained from the current calculation equation.

5. The method according to claim 4, wherein the step of modifying the current calculation equation includes the step of evaluating the degree of coincidence between the capacitor's actual measured current value m(t) and the calculated current value j(t) and the step of determining that m(t) is substantially equal to j(t) includes determining whether the degree of coincidence falls within a predetermined range.

6. The method according to claim 5 wherein, evaluation of the degree of coincidence of the capacitor's actual measured current value m(t) and calculated current value j(t), includes performing a linear approximation of one of the ratio of m(t) and j(t), the difference between m(t) and j(t), the difference between the logarithmic value of m(t) and j(t), and the ratio of respective logarithmic values of m(t) and j(t).

7. The method according to claim 1, wherein the step of determining the standardized selection value charge characteristic includes:

initially setting a current calculation equation for defining the standardized selection value charge characteristic of the dielectric polarization component by use of an equivalent circuit of the capacitor, the equivalent circuit having capacities $C_1, C_2, \ldots, C_n$ and resistances $R_1, R_2, \ldots, R_n$ acting as the dielectric polarization component of the equivalent circuit; and modifying the current calculation equation by determining both the capacitances $C_1, C_2, \ldots, C_n$ and the resistances $R_1, R_2, \ldots, R_n$ so that the actual measured current value m(t) during an initial charge period of the dielectric polarization component is substantially identical to the calculated current value j(t) as obtained from the current calculation equation.

8. The method according to claim 7, wherein the capacitances $C_1, C_2, \ldots, C_n$ and the resistances $R_1, R_2, \ldots, R_n$ have respective geometric progression relations of $C_k = p^{k-1}C_1$ and $P_k = q^{k-1}R_1$, where $k=1, 2, \ldots, n$, and the step of modifying the current calculation equation includes:

determining the capacitances $C_1, C_2, \ldots, C_n$ and resistances $R_1, R_2, \ldots, R_n$ by modifying one or more of $C_1, R_1$ and p, q so that the actual measured current value m(t) during an initial charge period of the dielectric polarization component is substantially identical to the calculated current value j(t) as obtained from the current calculation equation.

9. The method according to claim 8, wherein the step of modifying the current calculation equation includes the step of evaluating the degree of coincidence between the capacitor's actual measured current value m(t) and the calculated current value j(t) and the step of determining that m(t) is substantially equal to j(t) includes determining whether the degree of coincidence falls within a predetermined range.

10. The method according to claim 9 wherein, evaluation of the degree of coincidence of the capacitor's actual measured current value m(t) and calculated current value j(t), includes performing a linear approximation of one of the ratio of m(t) and j(t), the difference between m(t) and j (t), the difference between the logarithmic value of m(t) and j(t), and the ratio of respective logarithmic values of m(t) and j(t).

* * * * *